(12) United States Patent
Saitoh et al.

(10) Patent No.: US 10,573,205 B2
(45) Date of Patent: Feb. 25, 2020

(54) FLEXIBLE DISPLAY DEVICE AND METHOD FOR MANUFACTURING FLEXIBLE DISPLAY DEVICE

(71) Applicant: Sharp Kabushiki Kaisha, Sakai, Osaka (JP)

(72) Inventors: Takao Saitoh, Sakai (JP); Masaki Yamanaka, Sakai (JP); Yohsuke Kanzaki, Sakai (JP); Seiji Kaneko, Sakai (JP); Masahiko Miwa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/467,072

(22) PCT Filed: Jun. 30, 2017

(86) PCT No.: PCT/JP2017/024148
§ 371 (c)(1),
(2) Date: Jun. 6, 2019

(87) PCT Pub. No.: WO2019/003417
PCT Pub. Date: Jan. 3, 2019

(65) Prior Publication Data
US 2019/0362656 A1    Nov. 28, 2019

(51) Int. Cl.
*G09F 9/30* (2006.01)
*H01L 51/52* (2006.01)
*H01L 27/32* (2006.01)
*G02F 1/1368* (2006.01)
*H01L 29/786* (2006.01)

(52) U.S. Cl.
CPC ............ *G09F 9/301* (2013.01); *G02F 1/1368* (2013.01); *H01L 27/3262* (2013.01); *H01L 29/78675* (2013.01); *H01L 51/5237* (2013.01); *H01L 2227/323* (2013.01); *H01L 2251/5338* (2013.01)

(58) Field of Classification Search
CPC ... G02F 1/1368; G09F 9/301; H01L 27/3262; H01L 29/78675; H01L 51/5237; H01L 2227/323; H01L 2251/5338
See application file for complete search history.

(56) References Cited

U.S. PATENT DOCUMENTS

2008/0171410 A1* 7/2008 Moriwaka ......... H01L 21/02422
                                                      438/166
2009/0004772 A1* 1/2009 Jinbo ................ H01L 21/02505
                                                      438/99

FOREIGN PATENT DOCUMENTS

| JP | 07-273339 A | 10/1995 |
| JP | 08-139018 A | 5/1996 |
| JP | 2008-085317 A | 4/2008 |
| JP | 2008-211191 A | 9/2008 |

OTHER PUBLICATIONS

Official Communication issued in International Patent Application No. PCT/JP2017/024148, dated Sep. 19, 2017.

* cited by examiner

*Primary Examiner* — Nathanael R Briggs
(74) *Attorney, Agent, or Firm* — Keating & Bennett, LLP

(57) ABSTRACT

A flexible organic EL display device includes a polycrystalline silicon layer in which an extent of alignment of a silicon crystal orientation by electron back scatter diffraction patterns with a 001 plane is greater than or equal to 3.

12 Claims, 8 Drawing Sheets

FLEXIBLE DISPLAY DEVICE AND METHOD FOR MANUFACTURING FLEXIBLE DISPLAY DEVICE

TECHNICAL FIELD

The disclosure relates to a flexible display device (flexible display device) and a method for manufacturing a flexible display device (flexible display device).

BACKGROUND ART

In recent years, various flat panel displays have been developed. Particularly, organic Electro Luminescence (EL) display devices including organic EL display elements are receiving great attention as excellent displays because a low power consumption, reduced thickness, higher picture quality, and the like can be achieved.

Further, display devices without a need for including a backlight, such as organic EL display devices and display devices including reflective liquid crystal display elements, are in a high demand to be flexible display devices so as to be freely bendable.

To achieve a flexible display device, there is a method for using a flexible substrate (flexible substrate) made of, for example, polyimide (PI) and the like and forming a thin film transistor element (TFT element) and a display element directly on the flexible substrate by a manufacturing step at a temperature less than or equal to a temperature that this flexible substrate can endure.

However, for this method, the temperature of the step of forming a TFT element and a display element needs to be less than or equal to the temperature at which a flexible substrate made of polyimide (PI) and the like can endure. Thus, a TFT element and a display element that can satisfy both aspects of element performance and reliability cannot be obtained. Accordingly, a method for manufacturing a flexible display device including a Laser Lift Off step (also referred to as an LLO step) described below is receiving attention.

FIGS. 8A to 8C are diagrams illustrating an LLO step included in steps of manufacturing a flexible organic EL display device.

As illustrated in FIG. 8A, a PI layer 102 made of, for example, a polyimide resin being a resin having a high heat resistance is first layered on a surface 101a on one side of a glass substrate 101 (non-flexible substrate) having a high heat resistance with a heat absorption layer (not illustrated) therebetween. A moisture-proof layer 103 being an inorganic film is layered on the PI layer 102. A TFT array layer 104 formed of a TFT element and an insulating film is formed on the moisture-proof layer 103. A first electrode (not illustrated) is patterned and formed on the TFT array layer 104 in association with an individual pixel by using a metal film in the same layer, and a terminal portion (not illustrated) is also formed on the TFT array layer 104. Then, any of a red light-emitting organic EL element 105R, a green light-emitting organic EL element 105G, and a blue light-emitting organic EL element 105B is formed on the first electrode. A sealing film 106 is formed to cover the red light-emitting organic EL element 105R, the green light-emitting organic EL element 105G, and the blue light-emitting organic EL element 105B.

Note that, each of the red light-emitting organic EL element 105R, the green light-emitting organic EL element 105G, and the blue light-emitting organic EL element 105B is, for example, a layered body of a hole injection layer, a hole transport layer, a light-emitting layer in each color, an electron transport layer, an electron injection layer, and a second electrode, all of which are not illustrated.

Subsequently, as illustrated in FIG. 8B, laser light irradiation is performed from the glass substrate 101 side. Accordingly, ablation occurs at an interface between the PI layer 102 and the glass substrate 101, and the glass substrate 101 is then peeled off from the PI layer 102.

Next, as illustrated in FIG. 8C, a back film 111 being a flexible substrate is bonded to the PI layer 102 with an adhesive layer (not illustrated) therebetween. The adhesive layer is provided on a surface 111a on one side of the back film 111. Then, the flexible organic EL display device is completed.

As described above, in a method for manufacturing a flexible organic EL display device that includes the above-described LLO step, a step of manufacturing a TFT element can be performed on the glass substrate 101 having a high heat resistance on which the PI layer 102 made of a polyimide resin being a resin having a high heat resistance and the moisture-proof layer 103 being an inorganic film are layered. Thus, the temperature of this step can be increased to about 450 degrees.

Therefore, when the LLO step is used, a TFT element and a display element having element performance and reliability being increased to a certain degree can be obtained.

CITATION LIST

Patent Literature

PTL 1: JP 7-273339 A (published on Oct. 20, 1995).
PTL 2: JP 8-139018 A (published on May 31, 1991).

SUMMARY

Technical Problem

However, when a TFT element is manufactured at a step temperature of lower than or equal to 450 degrees by using a large glass substrate to improve productivity, a problem arises that variation in the threshold voltage of the TFT element is generated depending on a position of the TFT element formed on the large glass substrate.

Such a problem can be reduced in steps of manufacturing a TFT element including a step of performing annealing on a silicon film at a temperature of higher than or equal to 600 degrees as described in PTLs 1 and 2. However, in steps of manufacturing a flexible display device including the above-described LLO step, a TFT element cannot be manufactured at a step temperature of higher than or equal to 600 degrees for the following reason.

The PI layer 102 formed on the glass substrate 101 illustrated in FIG. 8A can endure a step temperature up to only about 450 degrees even with the moisture-proof layer 103 being the inorganic film formed in the upper layer. Therefore, in steps of manufacturing a flexible display device including the LLO step, all steps subsequent to the step of forming the PI layer 102 need to be set at a step temperature of lower than or equal to 450 degrees, and the step of performing annealing on a silicon film at a temperature of higher than or equal to 600 degrees as described in PTLs 1 and 2 cannot be included in the steps.

As described above, there is the problem that the variation in the threshold voltage of a TFT element is inevitably relatively great in a case of a flexible display device manufactured by the method for manufacturing a flexible display device including the LLO step using a large glass substrate.

The disclosure has been made in view of the problem and an object thereof is to provide a flexible display device and a method for manufacturing a flexible display device in which variation in the threshold voltage of an active element (for example, a thin film transistor element) is suppressed.

Solution to Problem

To solve the problem, a flexible display device of the disclosure is a flexible display device including: an active element on a flexible substrate; and a display element on the flexible substrate, wherein the active element includes a silicon film as a semiconductor layer, and in the silicon film, an extent of alignment of a silicon crystal orientation by electron back scatter diffraction patterns with a 001 plane is greater than or equal to 3.

According to the configuration, the extent of the alignment of the silicon crystal orientation in the silicon film provided as the semiconductor layer to the active element with the 001 plane is greater than or equal to 3 when being obtained by electron back scatter diffraction patterns, and the extent of the alignment of the silicon crystal orientation with the 001 plane is relatively high. Thus, the flexible display device in which variation in the threshold voltage of the active element (for example, a thin film transistor element) is suppressed can be achieved.

To solve the problem, a method for manufacturing a flexible display device of the disclosure is a method for manufacturing a flexible display device including: a first step of forming a resin layer on a surface on one side of a non-flexible substrate; a second step of forming an inorganic film on the resin layer; a third step of forming an active element including a semiconductor layer on the inorganic film; a fourth step of forming a display element on a layer including the active element; a fifth step of performing laser light irradiation from the non-flexible substrate side and peeling off the non-flexible substrate from the resin layer; and a sixth step of bonding a flexible substrate to a surface of the resin layer from which the non-flexible substrate is peeled off, wherein in the third step, after an amorphous silicon film as the semiconductor layer is formed on the inorganic film, laser annealing is performed on the amorphous silicon film, and an extent of alignment of a silicon crystal orientation by electron back scatter diffraction patterns with a 001 plane is set to be greater than or equal to 3.

According to the method, in the third step, after the amorphous silicon film as the semiconductor layer is formed on the inorganic film, laser annealing is performed on the amorphous silicon film, and the extent of the alignment of the silicon crystal orientation by the electron back scatter diffraction patterns with the 001 plane is set to be greater than or equal to 3.

Therefore, the extent of the alignment of the silicon crystal orientation in the semiconductor layer provided in the active element with the 001 plane is relatively high. Thus, the method for manufacturing a flexible display device in which variation in the threshold voltage of the active element (for example, a thin film transistor element) is suppressed can be achieved.

Advantageous Effects of Disclosure

According to one aspect of the disclosure, a flexible display device and a method for manufacturing a flexible display device in which variation in the threshold voltage of an active element (for example, a thin film transistor element) is suppressed can be provided.

DESCRIPTION OF EMBODIMENTS

Figure 1:
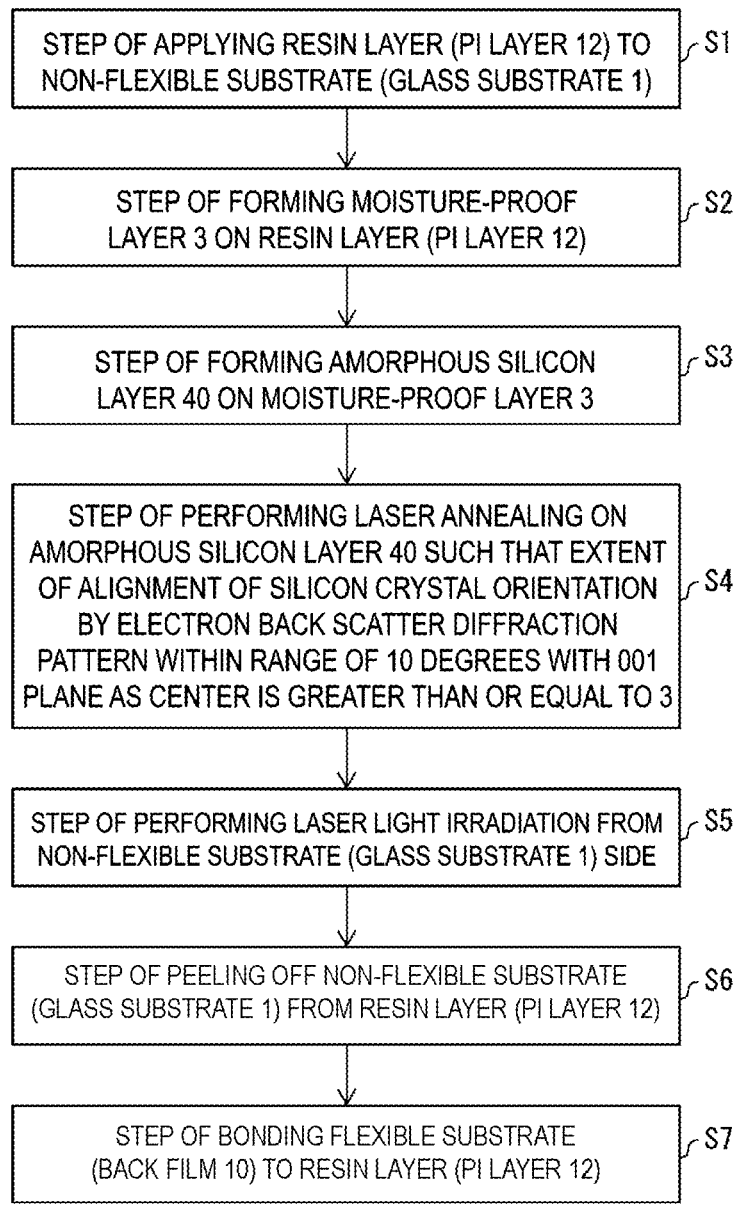
FIG. 1 is a diagram illustrating steps of manufacturing a flexible organic EL display device that includes an LLO step.

Embodiments of the disclosure are described below with reference to FIGS. 1A to 7C. Hereinafter, for the convenience of description, a configuration having the same functions as those of a configuration described in a specific embodiment are denoted by the same reference numerals, and the descriptions may be omitted.

Note that, a flexible organic EL display device including an organic EL light-emitting element as a display element on a flexible substrate is described as a flexible display device as one example in the following embodiments of the disclosure, which is not limited thereto. For example, a flexible display device including a reflective liquid crystal display element as a display element on a flexible substrate and the like may be used.

First Embodiment

A first embodiment of the disclosure will be described with reference to FIGS. 1A to 6.

FIG. 1 is a diagram illustrating steps of manufacturing a flexible organic EL display device 2 that includes an LLO step.

FIGS. 2A to 2G are diagrams schematically illustrating each of the steps of manufacturing the flexible organic EL display device 2 that includes the LLO step illustrated in FIG. 1.

Figure 2A:
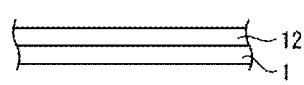
FIGS. 2A to 2G are diagrams schematically illustrating each of the steps of manufacturing a flexible organic EL display device that includes the LLO step illustrated in FIG. 1.

First, as illustrated in FIGS. 1 and 2A, a PI layer 12 made of a polyimide resin being a resin having a high heat resistance is applied as a resin layer to a surface on one side of a glass substrate 1 being a non-flexible substrate with a heat absorption layer (not illustrated) therebetween (Step S1).

After the application of the PI layer 12, heat treatment such as pre-bake, one or more of post-bake, and ashing as necessary is performed.

Note that, the temperature of heat treatment such as pre-bake, one or more of post-bake, and ashing needs to be set to be lower than or equal to the temperature at which the glass substrate 1 and the PI layer 12 can endure. In the present embodiment, the temperature of heat treatment such as pre-bake, one or more of post-bake, and ashing is appropriately set within a range of a temperature of lower than or equal to 450 degrees.

Further, before the PI layer 12 is applied to the surface on one side of the glass substrate 1, a coupling material may be applied to the surface on one side of the glass substrate 1 as necessary in order to improve the wettability of the PI layer 12 to the glass substrate 1.

Figure 2B:
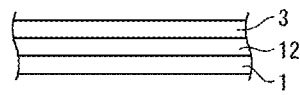

Next, as illustrated in FIGS. 1 and 2B, a film having one or more layers selected from a silicon oxide film, a silicon nitride film, and a silicon oxynitride film is formed as a moisture-proof layer 3 on the PI layer 12 (Step S2).

In the present embodiment, a film obtained by forming an inorganic film having one or more layers selected from a silicon oxide film, a silicon nitride film, and a silicon oxynitride film by CVD is used as the moisture-proof layer 3 in order to form a finer film.

Figure 2C:
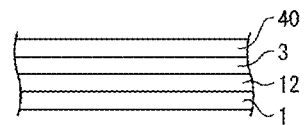

Then, as illustrated in FIGS. 1 and 2C, an amorphous silicon layer (amorphous silicon film) 40 is formed on the moisture-proof layer 3 by vapor deposition (Step S3).

After the amorphous silicon layer 40 is formed on the moisture-proof layer 3, dehydrogenation treatment can be performed as necessary.

Figure 2D:
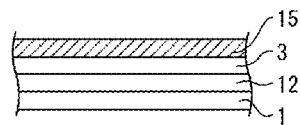

Then, as illustrated in FIGS. 1 and 2D, laser annealing is performed on the amorphous silicon layer 40 formed on the moisture-proof layer 3 (Step S4).

In the step of performing laser annealing on the amorphous silicon layer 40, as described later in detail, laser annealing is performed on the amorphous silicon layer 40 by adjusting an irradiated dose of laser light per unit surface area of the amorphous silicon layer 40, and a polycrystalline silicon layer (polycrystalline silicon film) 15 is formed.

Specifically, laser annealing is performed on the amorphous silicon layer 40 such that an extent of alignment of a silicon crystal orientation in the polycrystalline silicon layer 15 with proximity to a 001 plane, that is, within a range of 10 degrees with the 001 plane as the center, is greater than or equal to 3 when the extent is obtained by electron back scatter diffraction patterns.

Subsequently, the polycrystalline silicon layer 15 is patterned into a predetermined shape and used as a semiconductor layer of a TFT element, which is not illustrated.

Figure 2E:
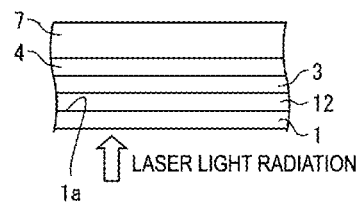
Figure 3:
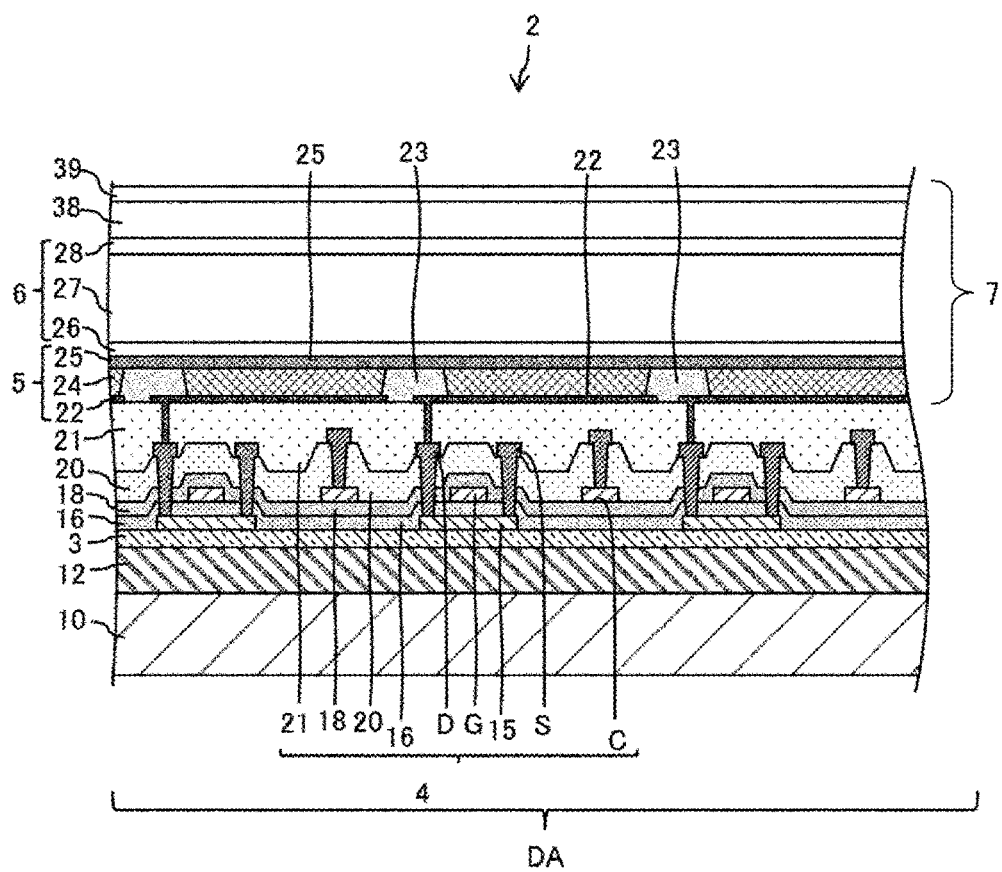
FIG. 3 is a diagram illustrating a schematic configuration of a flexible organic EL display device.

Note that, a TFT element layer 4 illustrated in FIG. 2E is a layer including respective layers (the polycrystalline silicon layer 15 patterned into a predetermined shape illustrated in FIG. 3, a gate insulating film 16, a gate electrode G, passivation films 18 and 20, a source wiring line S, and a drain wiring line D) that form the TFT element including the polycrystalline silicon layer 15; and an insulating layer (an organic interlayer film 21 illustrated in FIG. 3) that covers the TFT element.

Furthermore, the injection (doping) of various ions is performed on the polycrystalline silicon layer 15 as necessary, and the polycrystalline silicon layer 15 is used as a channel layer of the TFT element.

Then, as illustrated in FIG. 2E, a layered film 7 including an organic EL light-emitting element is formed on the TFT element layer 4.

Note that, the whole steps illustrated from FIG. 2B to FIG. 2E are performed within a range of a temperature lower than or equal to 450 degrees being the temperature at which the PI layer 12 can endure.

Figure 2F:
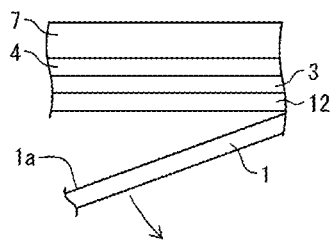

Subsequently, as illustrated in FIGS. 2E and 2F, laser light irradiation is performed from the glass substrate 1 side (Step S5). Accordingly, ablation occurs at an interface between the PI layer 12 and a heat absorption layer (not illustrated) on the glass substrate 1, and the glass substrate 1 is then peeled off from the PI layer 12 (Step S6).

Figure 2G:
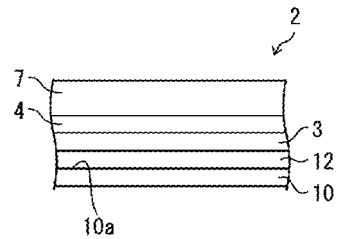

Next, as illustrated in FIG. 2G, a back film 10 being a flexible substrate is bonded to the PI layer 12 with an adhesive layer (not illustrated) therebetween (Step S7). The adhesive layer is provided on a surface 10a on one side of the back film 10. Then, the flexible organic EL display device 2 is completed.

FIG. 3 is a diagram illustrating a schematic configuration of a display region DA the flexible organic EL display device 2.

As illustrated, the PI layer 12 is formed on the back film 10, and the moisture-proof layer 3 is formed on the PI layer 12. Then, the TFT element layer 4 including the gate insulating film 16, the passivation films 18 and 20, and the organic interlayer film 21 is formed on the moisture-proof layer 3. An organic EL light-emitting element 5 as a display element is formed on the TFT element layer 4. Then, a sealing layer 6 including inorganic sealing films 26 and 28 and an organic sealing film 27 is formed to cover the organic EL light-emitting element 5.

A touch panel 39 is bonded to the sealing layer 6 with an adhesive layer 38 made of an optical clear adhesive (OCA) or an optical clear resin (OCR) therebetween.

Note that, respective layers (layers from a first electrode 22 to the touch panel 39) formed on the TFT element layer 4 are the layered film 7.

Examples of a material used for the back film 10 include a film made of polyethylene terephthalate (PET) and the like.

The TFT element layer 4 includes the polycrystalline silicon layer 15 as a semiconductor layer; the gate insulating film 16 formed in a layer above the polycrystalline silicon layer 15; the gate electrode G formed in a layer above the gate insulating film 16; the passivation films 18 and 20 that are formed in a layer above the gate electrode G; a capacitance electrode C and a terminal (not illustrated) that are formed in a layer above the passivation film 18; the source wiring line S and the drain wiring line D that are formed in a layer above the passivation film 20; and the organic interlayer film (flattering film) 21 formed in a layer above the source wiring line S and the drain wiring line D. Note that, in a non-display region of the TFT element layer 4, which is not illustrated, a plurality of terminals used for connection with an electronic circuit board are formed.

The gate insulating film 16 can be formed of, for example, a silicon oxide (SiOx) film, a silicon nitride (SiNx) film, or a layered film thereof formed using CVD. The gate electrode G, the source wiring line S, the drain wiring line D, and the terminal are formed of a metal single layer film or a layered film including, for example, at least one of aluminum (Al), tungsten (W), molybdenum (Mo), tantalum (Ta), chromium (Cr), titanium (Ti), or copper (Cu). Note that, in FIG. 3, the TFT element is illustrated that has a top gate structure including the polycrystalline silicon layer 15 as a channel, but the TFT element may have a bottom gate structure.

The passivation films 18 and 20 can be formed of, for example, a silicon oxide (SiOx) film, a silicon nitride (SiNx) film, or a layered film thereof formed using CVD. The organic interlayer film 21 can be formed of a coatable photosensitive organic material, such as polyimide or acrylic, for example. Note that, an edge of the terminal, which is not illustrated, is covered with the organic interlayer film 21.

The first electrode 22 (for example, an anode electrode), an organic insulating film 23 covering an edge of the first electrode 22, an EL layer 24 including a light-emitting layer formed in a layer above the first electrode 22, and a second electrode 25 formed in a layer above the EL layer 24 are formed in layers above the organic interlayer film 21. The first electrode 22, the EL layer 24, and the second electrode 25 constitute the organic EL light-emitting element 5. The organic insulating film 23 in the display region DA functions as a bank (pixel partition) that defines subpixels.

Note that, the organic insulating film 23 can be made of a coatable photosensitive organic material such as polyimide, or acrylic, for example.

The EL layer 24 including the light-emitting layer is formed in a region (subpixel region) surrounded by the organic insulating film 23 using a vapor deposition method or an ink-jet method. When the display element is the organic EL light-emitting element 5, the EL layer 24 including the light-emitting layer is formed by layering a hole injecting layer, a hole transport layer, a light emitting layer, an electron transport layer, and an electron injecting layer sequentially from the lower layer side, for example. Note that one or more layers of the EL layer 24 may be a shared layer (shared by a plurality of pixels).

The first electrode (anode) 22 is formed by layering of, for example, indium tin oxide (ITO) and an alloy including silver (Ag) and has a light reflectivity. The second electrode (for example, a cathode electrode) 25 is a common electrode and may be formed of a transparent metal such as silver (Ag), indium tin oxide (ITO), or indium zinc oxide (IZO).

Holes and electrons are recombined in the EL layer 24 by a driving current between the first electrode 22 and the second electrode 25 in the organic EL light-emitting element 5, and the excitons generated thereby fall to the ground state such that light is emitted.

The sealing layer 6 covers the organic EL light-emitting element 5 and prevents penetration of foreign matter, such as water and oxygen, into the organic EL light-emitting element 5. The sealing layer 6 includes a first inorganic sealing film 26 covering the organic insulating film 23 and the second electrode 25, the organic sealing film 27 that is formed in a layer above the first inorganic sealing film 26 and functions as a buffer film, and a second inorganic sealing film 28 covering the first inorganic sealing film 26 and the organic sealing film 27.

Each of the first inorganic sealing film 26 and the second inorganic sealing film 28 may be a silicon oxide film, a silicon nitride film, a silicon oxynitride film, or a layered film thereof formed by CVD using a mask. The organic sealing film 27 is a transparent organic insulating film that is thicker than the first inorganic sealing film 26 and the second inorganic sealing film 28, and the organic sealing film 27 may be formed of a coatable photosensitive organic material such as polyimide or acrylic. For example, after coating the first inorganic sealing film 26 with an ink containing such an organic material using the ink-jet method, the ink is hardened by UV irradiation, and thus the organic sealing film 27 can be formed.

Hereinafter, the polycrystalline silicon layer 15 provided as a semiconductor layer in the TFT element in the TFT element layer 4 in the flexible organic EL display device 2 is described with reference to FIGS. 4 to 6.

Figure 4:
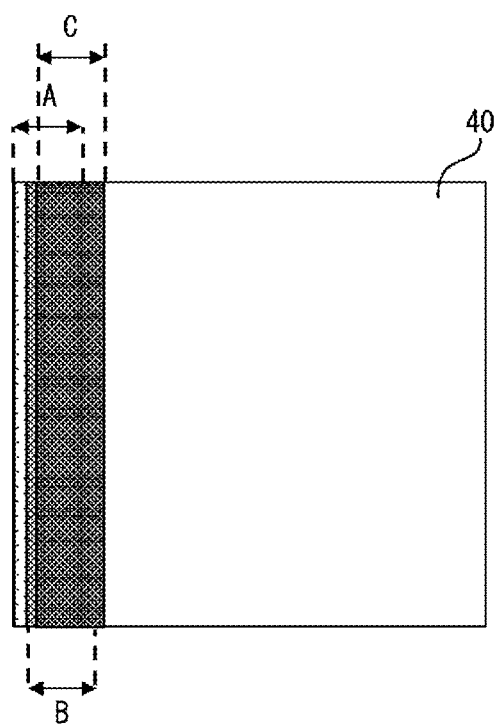
FIG. 4 is a diagram illustrating a step of performing laser annealing on an amorphous silicon film.

FIG. 4 is a diagram illustrating the step of performing laser annealing on the amorphous silicon layer 40.

In the present embodiment, as illustrated in FIG. 4, in the step of performing laser annealing on the entire amorphous silicon layer 40 provided on the glass substrate 1, laser annealing is successively performed on the entire amorphous silicon layer 40 provided on the glass substrate 1 such that a percentage of overlapping areas of an irradiated region A with laser light to the amorphous silicon layer 40 by scanning of laser light for a first time and an irradiated region B with laser light by scanning of laser light for a second time is greater than or equal to 90%, and a percentage of overlapping areas of the irradiated region B with laser light by scanning of laser light for the second time and an irradiated region C with laser light by scanning of laser light for a third time is greater than or equal to 90%.

Then, optimization is performed by appropriately adjusting the percentage of overlapping of the irradiated regions with laser light to be greater than or equal to 90% and within a range of greater than or equal to 90% a per unit surface area to be within a range of greater than or equal to 350 mJ/cm² and less than or equal to 500 mJ/cm², and by appropriately changing a ratio at which $O_2$ gas is added to $N_2$ gas as in an atmosphere in the step of performing laser annealing.

As described above, when an extent of alignment of a silicon crystal orientation with proximity to the 001 plane, that is, within a range of 10 degrees with the 001 plane as the center, is obtained by electron back scatter diffraction patterns, the polycrystalline silicon layer 15 having the extent of greater than or equal to 3 can be obtained by performing laser annealing within a range in an optimized condition.

Note that, as the percentage of overlapping of the irradiated regions with laser light is increased within the range of greater than or equal to 90% and less than or equal to 99%, and as the ratio at which $O_2$ gas is added to $N_2$ gas is reduced in the atmosphere in the step of performing laser annealing, an extent of alignment of a silicon crystal orientation with proximity to the 001 plane can be improved.

Figure 5A:
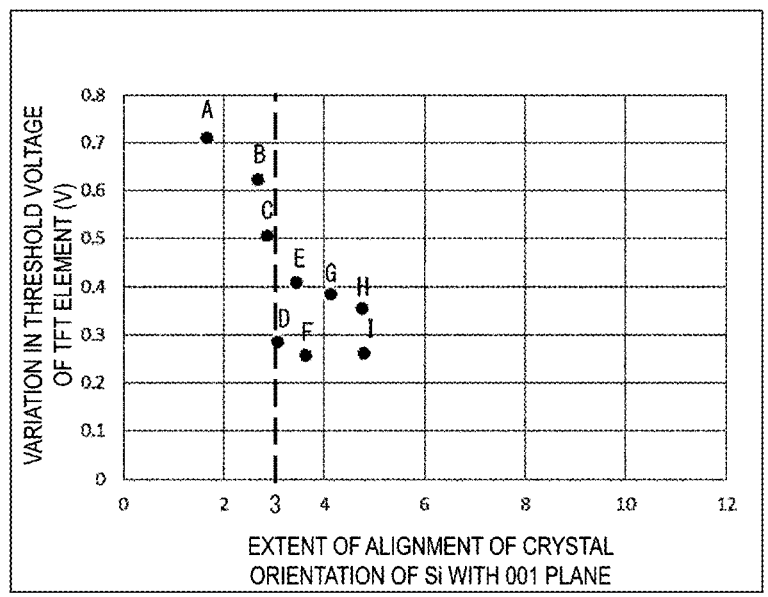
FIG. 5A is a diagram illustrating an extent of an in-plane variation in a substrate in the threshold voltage of a TFT element when respective polycrystalline silicon layers having different extents of alignment of a silicon crystal orientation obtained by electron back scatter diffraction patterns with a 001 plane are formed on large substrates A to I and then are used as semiconductor layers.
Figure 5B:
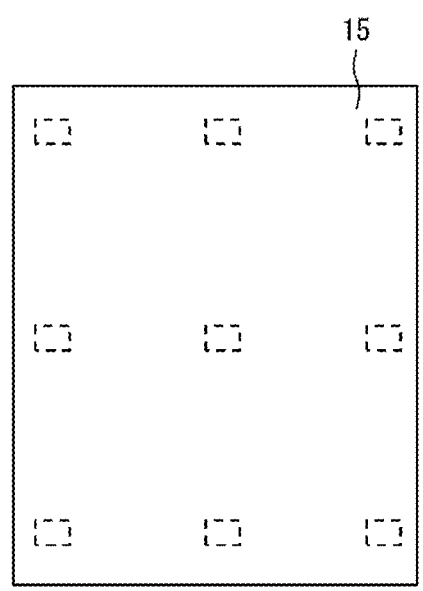
FIG. 5B is a diagram illustrating positions in which the threshold voltage of the TFT element is measured in each of the large substrates.

FIG. 5A is a diagram illustrating an extent of an in-plane variation in a substrate in the threshold voltage of a TFT element when respective polycrystalline silicon layers having different extents of alignment of a silicon crystal orientation obtained by electron back scatter diffraction patterns with the 001 plane are formed on large substrates A to I and then are used as semiconductor layers. FIG. 5B is a diagram illustrating positions in which the threshold voltage of the TFT element is measured in each of the large substrates A to I.

As illustrated in FIG. 5A, polycrystalline silicon layers having different extents of alignment of a silicon crystal orientation obtained by electron back scatter diffraction patterns with the 001 plane, specifically, values of from 1.6 to 4.9, are provided on the respective large substrates A to I.

A polycrystalline silicon layer in which an extent of alignment of a silicon crystal orientation obtained by electron back scatter diffraction patterns with the 001 plane is 1.6 is provided on the large substrate A. A polycrystalline silicon layer in which an extent of alignment of a silicon crystal orientation obtained by electron back scatter diffraction patterns with the 001 plane is 2.6 is provided on the large substrate B. A polycrystalline silicon layer in which an extent of alignment of a silicon crystal orientation obtained by electron back scatter diffraction patterns with the 001 plane is 2.8 is provided on the large substrate C. A polycrystalline silicon layer in which an extent of alignment of a silicon crystal orientation obtained by electron back scatter diffraction patterns with the 001 plane is 3.1 is provided on the large substrate D. A polycrystalline silicon layer in which an extent of alignment of a silicon crystal orientation obtained by electron back scatter diffraction patterns with the 001 plane is 3.4 is provided on the large substrate E. A polycrystalline silicon layer in which an extent of alignment of a silicon crystal orientation obtained by electron back scatter diffraction patterns with the 001 plane is 3.6 is provided on the large substrate F. A polycrystalline silicon layer in which an extent of alignment of a silicon crystal orientation obtained by electron back scatter diffraction patterns with the 001 plane is 4.2 is provided on the large substrate G. A polycrystalline silicon layer in which an extent of alignment of a silicon crystal orientation obtained by electron back scatter diffraction patterns with the 001 plane is 4.8 is provided on the large substrate H. A polycrystalline silicon layer in which an extent of alignment of a silicon crystal orientation obtained by electron back scatter diffraction patterns with the 001 plane is 4.9 is provided on the large substrate I.

Each of the large substrates A to C includes the polycrystalline silicon layer obtained by performing laser annealing in a condition in which the percentage of overlapping of the irradiated regions with laser light is less than 90%.

On the other hand, each of the large substrates D to I includes the polycrystalline silicon layer obtained by performing laser annealing in a condition optimized by appropriately adjusting the percentage of overlapping of the irradiated regions with laser light to be greater than or equal to 90% and within a range of greater than or equal to 90% and less than or equal to 99%, by appropriately adjusting an irradiated dose of laser light per unit surface area to be within a range of greater than or equal to 350 mJ/cm² and less than or equal to 500 mJ/cm², and by appropriately changing a ratio at which $O_2$ is added to $N_2$ as in an atmosphere in the step of performing laser annealing.

Note that, as described above, the polycrystalline silicon layers provided in the respective large substrates D to I have extents of alignment of a silicon crystal orientation with the 001 plane in descending order of the large substrate D, the large substrate E, the large substrate F, the large substrate G, the large substrate H, and the large substrate I. Laser annealing is performed in a condition in which a percentage of overlapping of irradiated regions with laser light is increased within a range of greater than or equal to 90% and less than or equal to 99% in order of the large substrate D, the large substrate E, the large substrate F, the large substrate G, the large substrate H, and the large substrate I, and a ratio at which $O_2$ gas is added to $N_2$ gas is also reduced in order of the large substrate D, the large substrate E, the large substrate F, the large substrate G, the large substrate H, and the large substrate I.

Then, the threshold voltage of the TFT element is measured at nine positions illustrated in FIG. 5B in each of the large substrates A to I, and a difference between a maximum value and a minimum value thereof is a variation in the threshold voltage of the TFT element in FIG. 5A.

As illustrated in FIG. 5A, in the large substrates A to C in which the extent of alignment of a silicon crystal orientation obtained by electron back scatter diffraction patterns with the 001 plane is relatively low, being less than 3, a variation in the threshold voltage of the TFT element is relatively great, being greater than or equal to 0.5 V.

The reason is that, when silicon crystals in different alignment are adjacent to each other, a dangling bond is generated in a grain boundary thereof, and a carrier is more likely to be captured by the dangling bond, which causes the variation in the threshold voltage of the TFT element.

A region having many dangling bonds is located in the large substrates A to C in which the extent of alignment of a silicon crystal orientation obtained by electron back scatter diffraction patterns with the 001 plane is relatively low, being less than 3. Thus, the region increases the variation in the threshold voltage of the TFT element in the substrate.

On the other hand, as illustrated in FIG. 5A, in the large substrates D to I in which the extent of alignment of a silicon crystal orientation obtained by electron back scatter diffraction patterns with the 001 plane is relatively high, being greater than or equal to 3, a variation in the threshold voltage of the TFT element is relatively small, being less than or equal to 0.42 V.

The reason is that, for the large substrates D to I, when silicon crystals in different alignment are adjacent to each other, the number of dangling bonds generated in a grain boundary thereof is greatly reduced, and a region having many dangling bonds is not located in the large substrates D to I even though a region having a dangling bond might be located. Thus, the variation in the threshold voltage of the TFT element in the substrate can be suppressed.

Figure 6:
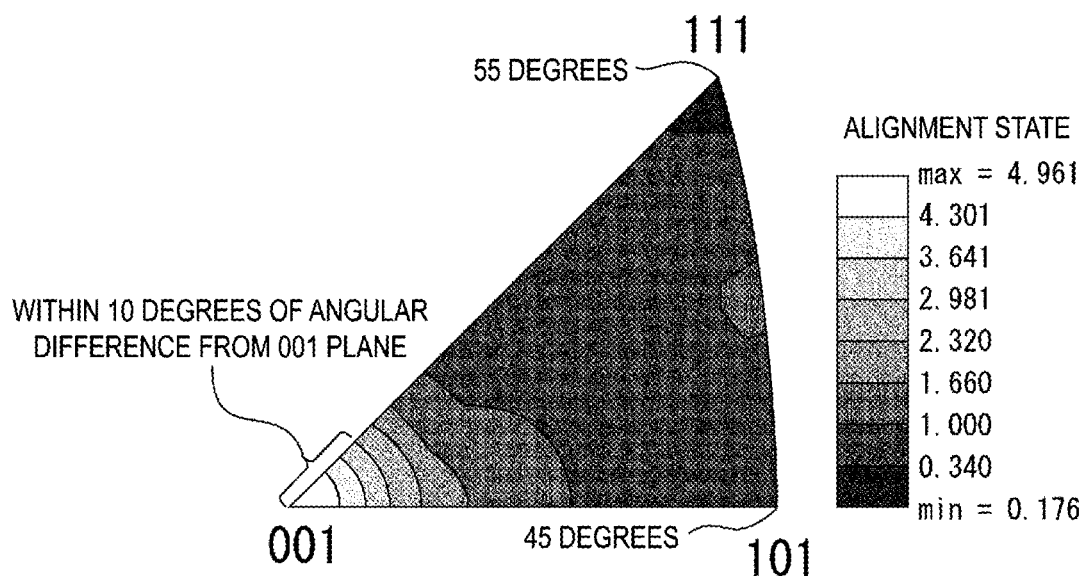
FIG. 6 is a reversed polarity diagram of one region of the polycrystalline silicon layer of the large substrate I illustrated in FIG. 5A obtained by electron back scatter diffraction patterns.

FIG. 6 is a reversed polarity diagram of one region of the polycrystalline silicon layer of the large substrate I illustrated in FIG. 5A obtained by electron back scatter diffraction patterns.

As illustrated in FIG. 6, for the polycrystalline silicon layer of the large substrate I illustrated in FIG. 5A, it is indicated that an extent of alignment of a silicon crystal orientation by electron back scatter diffraction patterns with the 001 plane is 4.30 to 4.961, and an extent of alignment within a range of 10 degrees with the 001 plane as the center is also greater than or equal to 3.

On the other hand, a silicon crystal orientation of the polycrystalline silicon layer of the large substrate I is hardly aligned with a 101 plane that forms 45 degrees with the 001 plane and a 111 plane that forms 55 degrees with the 001 plane.

As described above, the polycrystalline silicon layer in which an extent of alignment of a silicon crystal orientation obtained by electron back scatter diffraction patterns with the 001 plane is relatively high, being greater than or equal to 3, is used as a semiconductor layer in the flexible organic EL display device 2. Thus, variation in the threshold voltage of the TFT element can be suppressed even without performing a step of heat treatment at a high temperature.

Figure 7A:
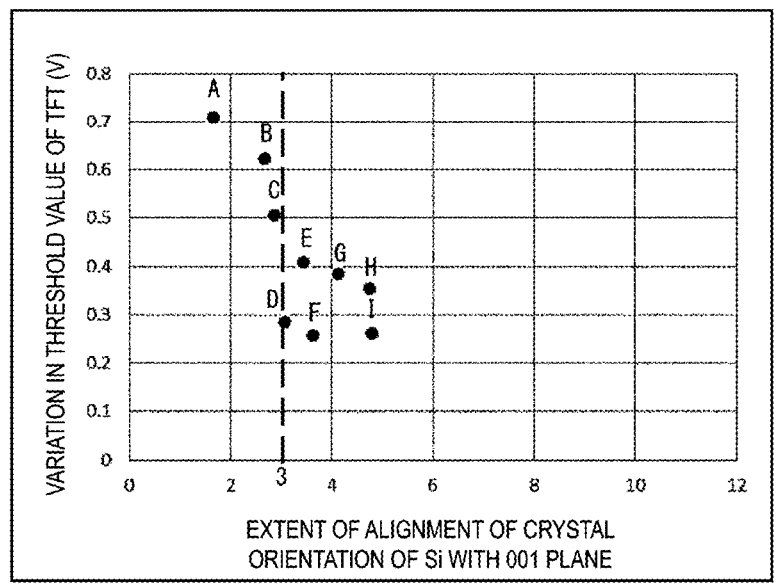
FIGS. 7A to 7C are diagrams illustrating that a TFT element characteristic varies between the large substrate A and the large substrate I provided with polycrystalline silicon layers having different extents of alignment of a silicon crystal orientation obtained by electron back scatter diffraction patterns with the 001 plane.
Figure 7B:
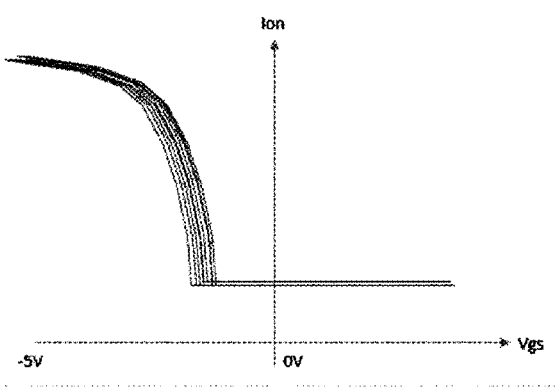
Figure 7C:
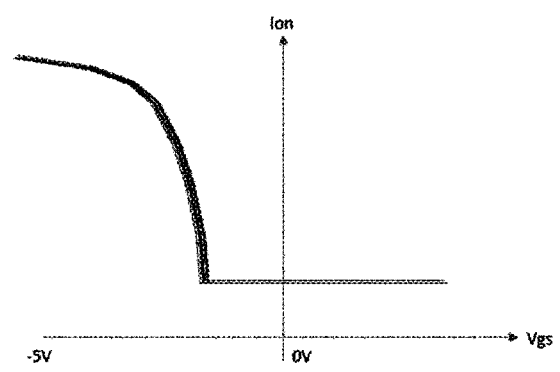
Figure 8A:
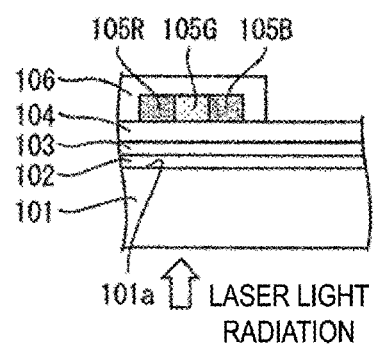
FIGS. 8A to 8C are diagrams illustrating an LLO step included in steps of manufacturing a flexible organic EL display device in the related art.
Figure 8B:
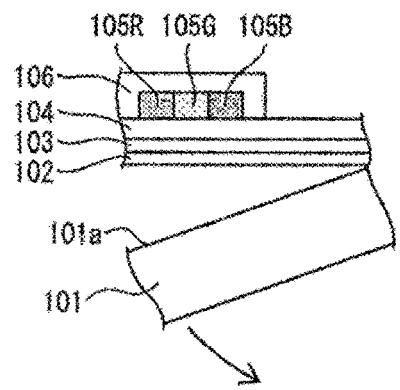
Figure 8C:
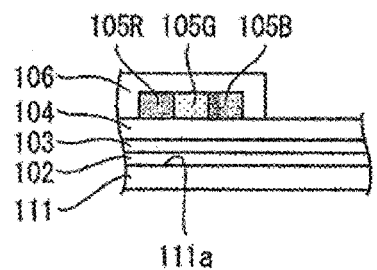

FIGS. 7A to 7C are diagrams illustrating that a TFT element characteristic (Vgs-Ion characteristic) varies between the large substrate A and the large substrate I provided with polycrystalline silicon layers having different extents of alignment of a silicon crystal orientation obtained by electron back scatter diffraction patterns with the 001 plane.

As illustrated in FIG. 7A, for the polycrystalline silicon layer provided in the large substrate I, an extent of alignment of a silicon crystal orientation obtained by electron back scatter diffraction patterns with the 001 plane is higher than that of the polycrystalline silicon layer provided in the large substrate A.

Then, for the polycrystalline silicon layer provided in the large substrate I, the number of dangling bonds is greatly lower than that of the polycrystalline silicon layer provided in the large substrate A.

FIG. 7B is a result of measuring a Vgs-Ion characteristic being one of TFT element characteristics at the nine places illustrated in FIG. 5B by using, as a semiconductor layer, the polycrystalline silicon layer provided in the large substrate A having a great number of dangling bonds.

As illustrated in FIG. 7B, Vgs-Ion curves do not overlap each other and appear to relatively greatly vary at the nine places illustrated in FIG. 5B.

On the other hand, FIG. 7C is a result of measuring a Vgs-Ion characteristic being one of TFT element characteristics at the nine places illustrated in FIG. 5B by using, as a semiconductor layer, the polycrystalline silicon layer provided in the large substrate I having a greatly reduced number of dangling bonds.

Vgs-Ion curves illustrated in FIG. 7C overlap each other well in comparison with the Vgs-Ion curves illustrated in FIG. 7B, and a variation in Vgs-Ion characteristic at the nine places illustrated in FIG. 5B is greatly improved.

Note that, although it is not illustrated, a variation in Vgs-Ion characteristic at the nine places illustrated in FIG. 5B of the large substrates D to H can also be greatly improved similarly to the case illustrated in FIG. 7C.

While a variation in Vgs-Ion characteristic at the nine places illustrated in FIG. 5B can be improved, an extent of alignment of a silicon crystal orientation obtained by electron back scatter diffraction patterns of a polycrystalline silicon layer with the 001 plane is preferably greater than or equal to 3 and less than 4 in consideration of improvement in productivity of the flexible organic EL display device 2.

A percentage of overlapping of irradiated regions with laser light when an extent of alignment of a silicon crystal orientation obtained by electron back scatter diffraction patterns of a polycrystalline silicon layer with the 001 plane is greater than or equal to 3 and less than 4 is lower than a percentage of overlapping of irradiated regions with laser light when an extent of alignment with the 001 plane is greater than or equal to 4. Thus, time needed for laser annealing can be reduced.

Note that, the flexible display (flexible display device) according to the present embodiment is not particularly limited as long as it is a flexible and bendable display panel provided with optical elements. The optical element is an optical element whose luminance and transmittance are controlled by an electric current, and examples of the electric current-controlled optical element include an organic Electro Luminescence (EL) display provided with an Organic Light Emitting Diode (OLED), an EL display such as an inorganic EL display provided with an inorganic light emitting diode, or a Quantum Dot Light Emitting Diode (QLED) display provided with a QLED.

Supplement

To solve the problem, a flexible display device of aspect 1 of the disclosure is a flexible display device including: an active element on a flexible substrate; and a display element on the flexible substrate, wherein the active element includes a silicon film as a semiconductor layer, and in the silicon film, an extent of alignment of a silicon crystal orientation by electron back scatter diffraction patterns with a 001 plane is greater than or equal to 3.

According to the configuration, the extent of the alignment of the silicon crystal orientation in the silicon film provided as the semiconductor layer to the active element with the 001 plane is greater than or equal to 3 when being obtained by electron back scatter diffraction patterns, and the extent of the alignment of the silicon crystal orientation with the 001 plane is relatively high. Thus, the flexible display device in which variation in the threshold voltage of the active element (for example, a thin film transistor element (TFT element)) is suppressed can be achieved.

In a flexible display device of aspect 2 of the disclosure, the flexible display device being according to the aspect 1, in the silicon film, an extent of alignment of a silicon crystal orientation by electron back scatter diffraction patterns with the 001 plane may be greater than or equal to 3 and less than 4.

According to the configuration, the extent of the alignment of the silicon crystal orientation obtained by the electron back scatter diffraction patterns with the 001 plane is greater than or equal to 3 and less than 4. Thus, variation in the threshold voltage of the active element (TFT element) can be suppressed, and time needed for laser annealing can also be reduced further than that when an extent of alignment of the silicon crystal orientation obtained by the electron back scatter diffraction patterns with the 001 plane is greater than or equal to 4. Accordingly, productivity can be improved.

In a flexible display device of aspect 3 of the disclosure, the flexible display device being according to the aspect 1 or 2, the silicon film preferably contacts an inorganic film in a layered film, including a resin film and the inorganic film, provided on the flexible substrate.

According to the configuration, the silicon film contacts the inorganic film in the layered film, including the resin film and the inorganic film, provided on the flexible substrate, and thus the inorganic films directly contact each other. Accordingly, the wettability of the silicon film to the inorganic film is excellent, and peeling off the silicon film from the inorganic film and the like can also be suppressed.

In a flexible display device of aspect 4 of the disclosure, the flexible display device being according to the aspect 3, the flexible substrate and the resin film in the layered film may be bonded to each other with an adhesive layer between the flexible substrate and the resin film.

According to the configuration, the flexible display device in which the flexible substrate and the resin film in the layered film are bonded to each other with the adhesive layer between the flexible substrate and the resin film can be achieved.

In a flexible display device of aspect 5 of the disclosure, the flexible display device being according to the aspect 3 or 4, the resin film preferably includes a polyimide resin.

According to the configuration, the resin film includes a polyimide resin having a high heat resistance in the flexible display device. Thus, the temperature of the step of forming a silicon film in the active element can be set to be a relatively high temperature.

In a flexible display device of aspect 6 of the disclosure, the flexible display device being according to any of the aspects 3 to 5, the inorganic film may include a film having one or more layers selected from a silicon oxide film, a silicon nitride film, and a silicon oxynitride film.

According to the configuration, in the flexible display device, the inorganic film includes a film having one or more layers selected from a silicon oxide film, a silicon nitride film, and a silicon oxynitride film. Thus, the inorganic film is a moisture-proof layer of the active element and the display element.

In a flexible display device of aspect 7 of the disclosure, the flexible display device being according to any of the aspects 1 to 6, the display element may include a reflective liquid crystal display element.

According to the configuration, a reflection-type flexible liquid crystal display device can be achieved.

In a flexible display device of aspect 8 of the disclosure, the flexible display device being according to any of the aspects 1 to 6, the display element may include an organic EL display element.

According to the configuration, the flexible organic EL display device can be achieved.

To solve the problem, a method for manufacturing a flexible display device of aspect 9 of the disclosure is a method for manufacturing a flexible display device including: a first step of forming a resin layer on a surface on one side of a non-flexible substrate; a second step of forming an inorganic film on the resin layer; a third step of forming an active element including a semiconductor layer on the inorganic film; a fourth step of forming a display element on a layer including the active element; a fifth step of performing laser light irradiation from the non-flexible substrate side and peeling off the non-flexible substrate from the resin layer; and a sixth step of bonding a flexible substrate to a surface of the resin layer from which the non-flexible substrate is peeled off, wherein in the third step, after an amorphous silicon film as the semiconductor layer is formed on the inorganic film, laser annealing is performed on the amorphous silicon film, and an extent of alignment of a silicon crystal orientation by electron back scatter diffraction patterns with a 001 plane is set to be greater than or equal to 3.

According to the method, in the third step, after the amorphous silicon film as the semiconductor layer is formed on the inorganic film, laser annealing is performed on the amorphous silicon film, and the extent of the alignment of the silicon crystal orientation by the electron back scatter diffraction patterns with the 001 plane is set to be greater than or equal to 3.

Therefore, the extent of the alignment of the silicon crystal orientation in the semiconductor layer provided in the active element with the 001 plane is relatively high. Thus, the method for manufacturing a flexible display device in which variation in the threshold voltage of the active element (for example, a thin film transistor element (TFT element)) is suppressed can be achieved.

In a method for manufacturing a flexible display device of aspect 10 of the disclosure, the method for manufacturing a flexible display device being according to the aspect 9, in the third step, laser annealing is preferably performed on the amorphous silicon film, and an extent of alignment of a silicon crystal orientation by the electron back scatter diffraction patterns with the 001 plane is preferably greater than or equal to 3 and less than 4.

According to the method, the extent of the alignment of the silicon crystal orientation obtained by the electron back scatter diffraction patterns with the 001 plane is greater than or equal to 3 and less than 4. Thus, variation in the threshold voltage of the active element (TFT element) can be suppressed, and time needed for laser annealing can also be reduced further than that when an extent of alignment of the silicon crystal orientation obtained by the electron back scatter diffraction patterns with the 001 plane is greater than or equal to 4. Accordingly, productivity can be improved.

In a method for manufacturing a flexible display device of aspect 11 of the disclosure, the method for manufacturing a flexible display device being according to the aspect 9 or 10, the resin layer preferably includes a polyimide resin.

According to the method, the resin film includes a polyimide resin having a high heat resistance. Thus, the temperature of the step of forming a silicon film in the active element can be set to be a relatively high temperature.

In a method for manufacturing a flexible display device of aspect 12 of the disclosure, the method for manufacturing a flexible display device being according to any of the aspects 9 to 11, the inorganic film may include a film having one or more layers selected from a silicon oxide film, a silicon nitride film, and a silicon oxynitride film.

According to the method, the inorganic film includes a film having one or more layers selected from a silicon oxide film, a silicon nitride film, and a silicon oxynitride film. Thus, the inorganic film is a moisture-proof layer of the active element and the display element.

In a method for manufacturing a flexible display device of aspect 13 of the disclosure, the method for a flexible display device being according to any of the aspects 9 to 12, the display element may include a reflective liquid crystal display element.

According to the method, a reflection-type flexible liquid crystal display device can be achieved.

In a method for manufacturing a flexible display device of aspect 14 of the disclosure, the method for a flexible display device being according to any of the aspects 9 to 12, the display element may include an organic EL display element.

According to the method, the flexible organic EL display device can be achieved.

Additional Items

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

INDUSTRIAL APPLICABILITY

The disclosure can be used for a laser device and a method for manufacturing a flexible display device using a laser device.

REFERENCE SIGNS LIST

1 Glass substrate (non-flexible substrate)
2 Flexible organic EL display device (flexible display device)
3 Moisture-proof layer (inorganic film)
4 TFT element layer
5 Organic EL light-emitting element (display element)
7 Layered film
10 Back film (flexible substrate)
12 PI layer (resin layer)
15 Polycrystalline silicon layer (polycrystalline silicon film)
40 Amorphous silicon layer (amorphous silicon film)

The invention claimed is:
1. A flexible display device comprising:
an active element on a flexible substrate; and
a display element on the flexible substrate,
wherein the active element includes a silicon film as a semiconductor layer, in the silicon film, an extent of alignment of a silicon crystal orientation by electron back scatter diffraction patterns with a 001 plane is greater than or equal to 3 and less than 4.

2. The flexible display device according to claim 1, wherein the silicon film contacts an inorganic film in a layered film, including a resin film and the inorganic film, provided on the flexible substrate.

3. The flexible display device according to claim 2, wherein the flexible substrate and the resin film in the layered film are bonded to each other with an adhesive layer between the flexible substrate and the resin film.

4. The flexible display device according to claim 2, wherein the resin film comprises a polyimide resin.

5. The flexible display device according to claim 2, wherein the inorganic film comprises a film having one or more layers selected from a silicon oxide film, a silicon nitride film, and a silicon oxynitride film.

6. The flexible display device according to claim 1, wherein the display element comprises a reflective liquid crystal display element.

7. The flexible display device according to claim 1, wherein the display element comprises an organic EL display element.

8. A method for manufacturing a flexible display device comprising:
   a first step of forming a resin layer on a surface on one side of a non-flexible substrate;
   a second step of forming an inorganic film on the resin layer;
   a third step of forming an active element including a semiconductor layer on the inorganic film;
   a fourth step of forming a display element on a layer including the active element;
   a fifth step of performing laser light irradiation from the non-flexible substrate side and peeling off the non-flexible substrate from the resin layer; and
   a sixth step of bonding a flexible substrate to a surface of the resin layer from which the non-flexible substrate is peeled off,
   wherein in the third step, after an amorphous silicon film as the semiconductor layer is formed on the inorganic film, laser annealing is performed on the amorphous silicon film, and an extent of alignment of a silicon crystal orientation by electron back scatter diffraction patterns with a 001 plane is set to be greater than or equal to 3 and less than 4.

9. The method for manufacturing a flexible display device according to claim 8, wherein the resin layer comprises a polyimide resin.

10. The method for manufacturing a flexible display device according to claim 8, wherein the inorganic film comprises a film having one or more layers selected from a silicon oxide film, a silicon nitride film, and a silicon oxynitride film.

11. The method for manufacturing a flexible display device according to claim 8, wherein the display element comprises a reflective liquid crystal display element.

12. The method for manufacturing a flexible display device according to claim 8, wherein the display element comprises an organic EL display element.

* * * * *